United States Patent
Guo

(10) Patent No.: US 10,574,209 B2
(45) Date of Patent: Feb. 25, 2020

(54) WAFER LEVEL PACKAGING APPROACH FOR SEMICONDUCTOR DEVICES

(71) Applicant: SEMICONDUCTOR MANUFACTURING INTERNATIONAL (SHANGHAI) CORPORATION, Shanghai (CN)

(72) Inventor: Liang Liang Guo, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 53 days.

(21) Appl. No.: 14/921,970

(22) Filed: Oct. 23, 2015

(65) Prior Publication Data

US 2016/0118324 A1    Apr. 28, 2016

(30) Foreign Application Priority Data

Oct. 24, 2014   (CN) .......................... 2014 1 0572405

(51) Int. Cl.
*H01L 23/498*     (2006.01)
*H03H 9/10*       (2006.01)

(52) U.S. Cl.
CPC .................................. *H03H 9/1014* (2013.01)

(58) Field of Classification Search
CPC .......... H01L 23/49827; H01L 23/5227; H01L 2224/16225; H01L 2224/16227; H01L 2223/6616

(Continued)

(56) References Cited

U.S. PATENT DOCUMENTS

2004/0032012 A1\*  2/2004  Wong ..................... H01L 21/50
                                                        257/678
2004/0087043 A1    5/2004  Lee et al.
                   (Continued)

FOREIGN PATENT DOCUMENTS

CN          1677705        10/2005
CN        101246895         8/2008
                   (Continued)

OTHER PUBLICATIONS

Chinese Application No. 201410572405.2, Office Action dated May 21, 2018, 5 pages.

(Continued)

*Primary Examiner* — Moazzam Hossain
*Assistant Examiner* — Hajar Kolahdouzan
(74) *Attorney, Agent, or Firm* — Kilpatrick Townsend & Stockton LLP

(57) ABSTRACT

A semiconductor device includes a substrate having a front surface and a back surface, a subassembly on the front surface of the substrate including first and second metal layers insulated from each other, a cap assembly including a metal connection member, and first and second through holes penetrating through the substrate and filled with metals. The metal filled in the first through hole is electrically connected to the first metal layer, and the metal filled in the second through hole is electrically connected to the second metal layer. The semiconductor device also includes a metal connection pad on the substrate that entirely surrounds the subassembly and is aligned with the metal connection member. The interface between the cap assembly and the subassembly is free of through holes to prevent a resistance change and shield the subassembly from interference.

20 Claims, 10 Drawing Sheets

(58) Field of Classification Search
USPC .......................................................... 257/737
See application file for complete search history.

(56) References Cited

U.S. PATENT DOCUMENTS

| | | | | |
|---|---|---|---|---|
| 2005/0079686 | A1 | 4/2005 | Aigner et al. | |
| 2006/0012021 | A1* | 1/2006 | Larson, III | H03B 5/326 257/686 |
| 2008/0081398 | A1 | 4/2008 | Lee et al. | |
| 2012/0306080 | A1* | 12/2012 | Yu | H01L 25/50 257/751 |
| 2014/0070346 | A1* | 3/2014 | Yang | H01L 24/13 257/428 |
| 2015/0041985 | A1* | 2/2015 | Hsieh | H01L 21/76879 257/773 |
| 2016/0064811 | A1* | 3/2016 | Yota | H01L 24/05 343/904 |
| 2016/0163729 | A1* | 6/2016 | Zhang | H01L 27/11582 257/321 |

FOREIGN PATENT DOCUMENTS

| | | | |
|---|---|---|---|
| CN | 104051364 | | 9/2014 |
| JP | 11186422 | | 7/1999 |
| JP | 2005109430 | | 4/2005 |
| KR | 20040085002 | * | 4/2006 |
| KR | 20060035483 | | 4/2006 |
| KR | 20070016855 | | 2/2007 |
| KR | 20050071904 | * | 8/2007 |
| WO | 2008023478 | | 2/2008 |

OTHER PUBLICATIONS

Chinese Application No. 201410572405.2, Office Action dated Sep. 29, 2017, 8 pages.

Chinese Application No. 201410572405.2, Office Action dated Apr. 10, 2019, 5 pages.

* cited by examiner

WAFER LEVEL PACKAGING APPROACH FOR SEMICONDUCTOR DEVICES

CROSS-REFERENCES TO RELATED APPLICATIONS

This application claims priority to Chinese patent application No. 201410572405.2, filed on Oct. 24, 2014, the content of which is incorporated herein by reference in its entirety.

TECHNICAL FIELD

The present invention relates to a semiconductor structure and method of manufacturing the same. More particularly, embodiments of the present invention relate to wafer-level packaging approaches of a variety of bulk acoustic wave (BAW) devices and a semiconductor device including a BAW device.

BACKGROUND OF THE INVENTION

Bulk acoustic wave (BAW) devices or film bulk acoustic resonator (FBAR) devices are widely used as RF filters in 4G LTE (Long Term Evolution) devices in order to obtain a high Q factor.

However, through-silicon vias (TSV) are performed through a cap substrate that has been assembled to the FBAR substrate according to conventional wafer-level packaging methods. In a conventional method, since the metal connection member of the cap substrate and the metal connection pad of the FBAR substrate may be of the same material or different materials and join at a contact interface, the contact interface will have a natural oxide layer resulting in a change of resistance at the contact interface. As shown in FIG. 1, the cap substrate 101 is assembled to the metal connection pad (indicated as an oval circle in FIG. 1). The bonding process of the contact interface between the metal connection pads of the cap substrate and the FBAR substrate may affect the resistance of the through hole via. Therefore, the conventional method of assembling the cap substrate to the BAW or FBAR device may adversely affect the resistance of the through via as an electric connecting element to an external circuit.

Conventional approaches utilize gold to form a connection 102. However, gold is expensive and may increase the manufacturing costs. Because gold is a heavy metal that may cause contamination resulting in a shorter minority carrier lifetime of a CMOS (complementary metal oxide semiconductor) device. Thus, it is difficult to meet the production requirements.

Therefore, there is a need to solve the problems of poor resistance in the contact interface between the metal connection pads of FBAR or BAW devices in the conventional packaging processes.

BRIEF SUMMARY OF THE INVENTION

Embodiments of the present invention provide a semiconductor device and method of manufacturing the semiconductor device. More particularly, some embodiments provide a packaging process for solving semiconductor device performance issues due to the resistance between the contact interface between a metal member of a cap assembly and a metal connection pad.

In an embodiment, a semiconductor device may include a substrate having a front surface and a back surface, a subassembly disposed on the front surface of the substrate, the subassembly may include a first metal layer and a second metal layer insulated from the first metal layer, a cap assembly including a metal connection member, first and second through holes penetrating through the substrate, the first and second through holes being filled with metals, the metal filled in the first through hole is electrically connected to the first metal layer, and the metal filled in the second through hole is electrically connected to the second metal layer. The semiconductor device also includes a metal connection pad disposed on the substrate and entirely surrounding the subassembly, and the metal connection pad is assembled (bonded) to the metal connection member.

In an embodiment, the semiconductor further includes a cavity in the substrate and located below the subassembly.

In an embodiment, the semiconductor device also includes first and second redistribution layer (RDL) wires on the back surface. The first RDL wire is electrically connected to the metal filled in the first through hole, and the second RDL wire is electrically connected to the metal filled in the second through hole.

In an embodiment, the semiconductor device also includes first and second bumps that are insulated from each other. The first bump is electrically connected to the first RDL wire, and the second bump is electrically connected to the second RDL wire.

In an embodiment, the semiconductor device also includes a first insulating layer disposed on the back surface of the substrate, and a second insulating layer disposed on the first insulating layer. The first and second insulating layers surround the first and second RDL wires.

In an embodiment, the semiconductor device also includes an insulating layer disposed between the substrate and the metal connection pad.

In an embodiment, the metal filled in the first through hole and the metal filled in the second through hole each are made of copper, aluminum, or tungsten.

In an embodiment, the metal connection member and the metal connection pad each are made of copper.

In an embodiment, the metal connection member is made of aluminum or germanium, and the metal connection pad is made of aluminum or germanium.

In an embodiment, the first and second metal layers are molybdenum layers.

Embodiments of the present invention also provide a method for manufacturing a semiconductor device. The method includes providing a substrate including a front surface and a back surface, forming first and second through holes in the substrate, filling the first and second through holes with metals, forming a subassembly on the front surface of the substrate, the subassembly comprising a first metal layer and a second metal layer insulated from the first metal layer. The first metal layer is electrically connected to the metal filled in the first through hole, and the second metal layer is electrically connected to the metal filled in the second through hole. The method also includes forming a metal connection pad disposed on the substrate, which may completely or partially surround the subassembly. The method also provides providing a cap assembly including a metal connection member, bonding the cap assembly with the subassembly, and thinning the back surface of the substrate to expose the first and second through holes.

In an embodiment, the method also includes, prior to forming first and second through holes, forming a cavity in the substrate, filling the cavity with a filler material, and after forming the subassembly, removing the filler material.

In an embodiment, the method further includes, after thinning the back surface of the substrate, forming a first insulating layer on the thinned back surface of the substrate, and forming a second insulating layer on the first insulating layer.

In an embodiment, the method further includes, before forming the second insulating layer, etching the first insulating layer to form a first opening exposing the first through hole and a second opening exposing the second through hole, and forming a redistribution material layer on the first insulating layer. The redistribution material layer is electrically connected to the metal filled in the first through hole and the metal filled in the second through hole. Additionally, the method includes patterning the redistribution material layer to form a first redistribution layer (RDL) wire on the first through hole and a second redistribution layer (RDL) wire on the second through hole, the first and second redistribution layer wires being electrically insulated from each other.

In an embodiment, the method further includes, after forming the second insulating layer, etching the second insulating layer to expose a portion of the first RDL wire and a portion of the second RDL wire, and forming a first bump on the exposed portion of the first RDL wire and a second bump on the exposed portion of the second RDL wire. The first and second bumps are electrically insulated from each other.

In an embodiment, forming the first and second through holes comprises forming a seed layer on the bottom and sidewalls of the first and second through holes, filling the first and second through holes by electroplating, and planarizing the substrate.

In an embodiment, the metal filled in the first through hole and the metal filled in the second through hole each are made of copper, aluminum, or tungsten.

In an embodiment, the metal connection member and the metal connection pad each are made of copper.

In an embodiment, bonding the cap assembly to the subassembly comprises pressing the metal connection member against the metal connection pad under a pressure in a range of about 2000 to about 3000 Newton, at a temperature in a range of about 400° C. to about 410° C., and for a time duration in a range of about 1 to about 2 hours.

In an embodiment, the metal connection member is made of aluminum or germanium, and the metal connection pad is made of aluminum or germanium The following description together with the accompanying drawings, will provide a better understanding of the nature and advantages of the claimed invention.

DETAILED DESCRIPTION OF THE INVENTION

Figure 1:
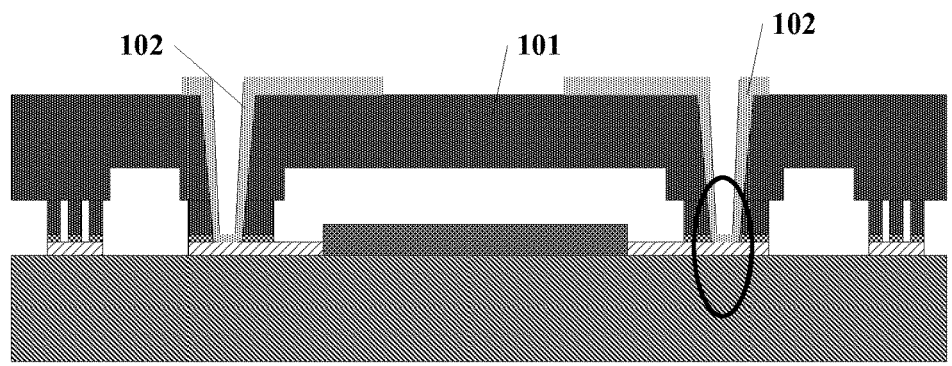
FIG. 1 is a cross-sectional view of an FBAR device, as known in the prior art.

The present invention will be described with respect to particular embodiments and with reference to certain drawings, but the invention is not limited thereto but only by the claims. It is noted that, unless otherwise specified, the relative arrangement of elements and steps set forth in the embodiments, numeric expressions and values shall not be construed as limiting the scope of the present invention.

The drawings described are only schematic and are non-limiting. In the drawings, the size of some of the elements may be exaggerated and not drawn to scale for illustrative purposes.

The following description of at least one embodiment is merely illustrative, and should not construed as limiting the present invention and its applications or use.

Method and devices known to people of skill in the art will not be discussed in detail for the sake of brevity. The conventional known techniques, methods and equipment should be considered as part of this disclosure.

Specific values provided in the exemplary embodiments shown and described herein should be construed as illustrative and not limiting. Thus, other exemplary embodiments may have different values.

It should be noted that like reference numerals and letters refer to similar items in the following figures. Thus, once an element is defined in one of the figures, it will not be further described in subsequent figures.

It will be understood that when an element is referred to as being "connected" to another element, it can be directly connected to other element or intervening elements may be present. In contrast, when an element is referred to as being "directly connected to" another element, there are no intervening elements present.

Spatially relative terms, such as "beneath", "below", "lower", "above", "upper", "on" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section, Thus, a first element, component, region, layer, or section discussed below could be termed a second element, component, region, layer, or section without departing from the teachings of the present invention.

Figure 2A:
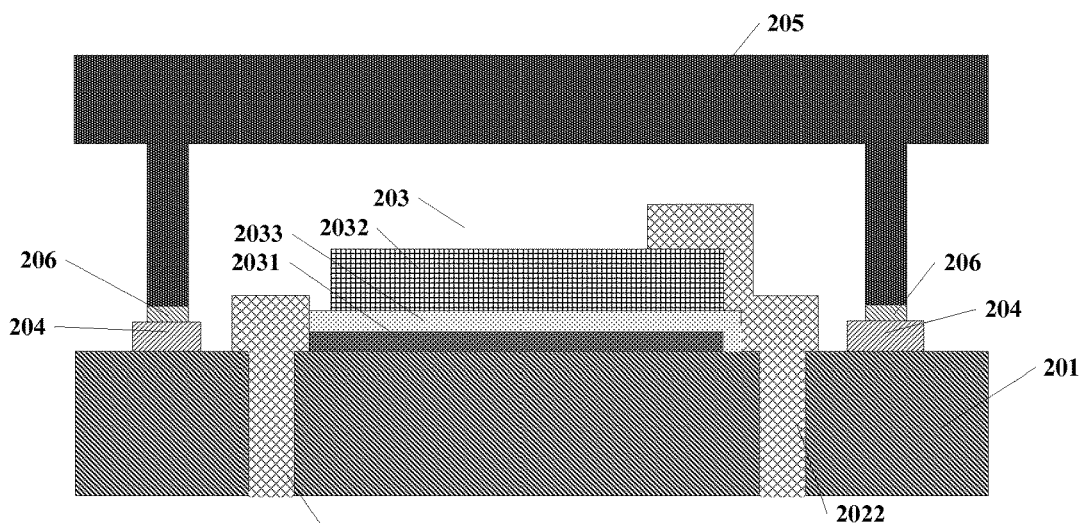
FIG. 2A is a cross-sectional view of a semiconductor device according to some embodiments of the present invention.

FIG. 2A is a cross-sectional view of a semiconductor device according to some embodiments of the present invention. As shown in FIG. 2A, a semiconductor device includes a substrate 201, for example, a silicon substrate. The semiconductor device also includes a subassembly 203 formed on the substrate. Subassembly 203 may include a first metal layer 2031, a second metal layer 2032, and an insulating layer 2033 disposed between the first and second metal layers.

The semiconductor device further includes a cap assembly 205 containing a metal connection member 206.

Substrate 201 includes a first through hole 2021 and a second through hole 2022. First and second through holes are filled with metals. The filled metal of first through hole 2021 is connected to first metal layer 2031 of subassembly 203, the filled metal of second through hole 2022 is connected to second metal layer 2032 of subassembly 203. Thus, the two metal layers (electrodes) 2031, 2032 of subassembly 203 can be electronically connected to an external device through the two through holes of the semiconductor device.

The through holes are filled with metals. In one embodiment, the through holes may not be completely filled with metals, i.e., voids may exist in the through holes as long as there is connection throughout the filled metal (no open circuit). Of course, the through holes may be completely filled with metal, i.e., there are no voids in the through holes. Due to the complete filling of the through holes, a better consistency of thermal expansion can be achieved, and the through holes are not prone to open circuit. This results in a lower and more stable resistivity, and better reliability. As is known to one of skill in the art, the term "through hole" used herein refers to a hole that extends entirely through the substrate and has openings at opposite ends of the hole. In some embodiments, the metal in first through hole 2021 and second through hole 2022 may be copper, aluminum or tungsten. Utilizing copper, aluminum or tungsten as a filled metal for the through holes can solve the contamination problem currently facing in the manufacturing processes using gold and, thereby reducing the production costs.

The semiconductor device also includes a metal connection pad 204 disposed on substrate 201 and surrounding subassembly 203. Metal connection member 206 may be aligned with and connected to the metal connection pad to form a subassembly package. The filled metal in first through hole 2021 may be connected to metal connection pad 204 or may be insulated therefrom. Insulation between the filled metal of the first through hole and the metal connection pad may reduce interference of the semiconductor device. Metal connection member 206 and metal connection pad 204 can be made of copper to form a Cu—Cu bonding. Those of skill in the art will appreciate that the present invention may also utilize other metal connection materials, e.g., the metal connection member may be aluminum and the metal connection pad may be germanium to form an Al—Ge bonding. The scope of the present invention is not limited thereto. In an embodiment, the metal connection pad may have a square, rectangular, circular ring-like shape (a plan view looking down on cap assembly 205 into substrate 201, not shown). It is understood that metal connection pad 204 and metal connection member each have a substantially planar surface for thermal compression bonding, in accordance with some embodiments of the present invention.

In the embodiment, the first and second through holes are filled with metals, the first through hole is connected to the first metal layer, and the second through hole is connected to the second metal layer. The first metal layer and the second metal layer are insulated from each other to form two electrodes of the subassembly, so that the two electrodes of the subassembly are connected to external components or devices without going through the metal connection member and the metal connection pad, thereby preventing a resistance change caused by the contact interface, which may result in poor device performance.

Figure 2B:
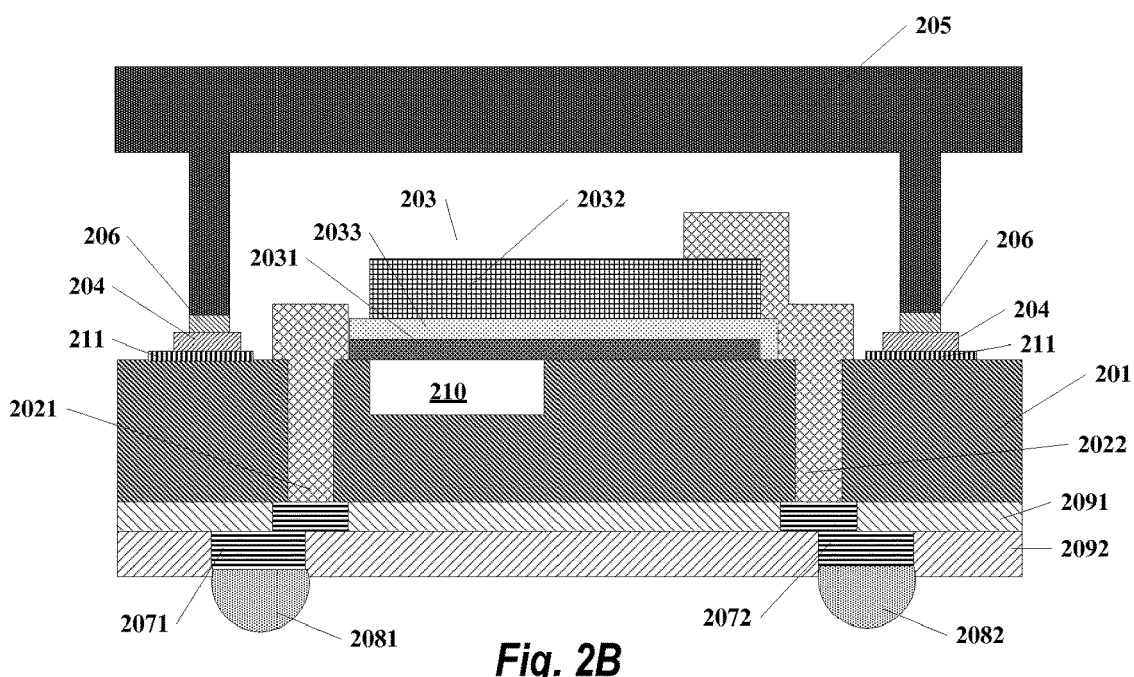
FIG. 2B is a cross-sectional view of a semiconductor device according to some other embodiments of the present invention.

FIG. 2B is a cross-sectional view of a semiconductor device according to some other embodiments of the present invention. As shown in FIG. 2B, the semiconductor device also includes a cavity 210 formed in the substrate below subassembly 203 (also shown in FIG. 8E). Cavity 210 formed in the substrate (substrate cavity) is used to prevent high frequency losses (e.g., eddy current loss). Of course, the shape of the substrate cavity shown in FIG. 2B is merely exemplary and should not limit the scope of the present invention.

Referring to FIG. 2B, in some embodiments of the present invention, the semiconductor device may further include a first redistribution layer (RDL) wire 2071 electrically connected to first through hole 2021 and a second redistribution layer wire 2072 electrically connected to second through hole 2022. The first and second redistribution layer wires are insulated from each other and formed on the back surface (opposite the front surface) of substrate 201. The first and second redistribution layer (RDL) wires each are made of copper and the like.

In some embodiments, in order to electrically connect the semiconductor device to an external circuit, the semiconductor also includes a first bump 2081 electrically connected to first RDL wire 2071 and a second bump 2082 electrically connected to second RDL wire 2072, the first and second bumps are electrically insulated from each other, as shown in FIG. 2B. The first and second bumps each are connectors configured to electrically connect the semiconductor device with one or more external electronic circuits. The bumps may be spherical bumps (conductive balls) configured to provide electrical contact points to connect to external devices.

In some embodiments, in order to insulate the first and second RDL wires from each other, the semiconductor device also includes a first insulating layer 2091 (alternatively referred to as a passivation layer) formed on the back surface of substrate 201 and a second insulating layer 2092 formed on first insulating layer 2091. As shown in FIG. 2B, first insulating layer 2091 and second insulating layer 2092 surround first RDL wire 2071 and second RDL wire 2072 to insulate the first and second RDL wires from each other and also to prevent external interference affecting the wires. First insulating layer 2091 also functions as a passivation layer, for example, to inactivate the back surface of the substrate. In some embodiments, the first and second insulating layers may be poly-p-phenylene benzobisthiazole (PBO). Of course, other insulating materials may also be used for the first and second insulating layers, the present invention is not limited to any particular insulating materials.

In some embodiments, the semiconductor device may also include an insulating layer 211 disposed between metal connection pad 204 and substrate 201, as shown in FIG. 2B. For example, insulating layer 211 may be an oxide (e.g., silicon oxide) or nitride (e.g., silicon nitride). Because metal connection pad 204 surrounds subassembly 203, insulating layer 211 also surrounds the subassembly.

In some embodiments, subassembly 203 also includes a dielectric layer 2033 disposed between first metal layer 2031 and second metal layer 2032 (as shown in FIGS. 2A and 2B). In an exemplary embodiment, first and second metal layers 2031, 2032 each may be molybdenum layer, and dielectric layer 2033 may be aluminum nitride (AlN). In exemplary embodiments of the present invention, subassembly 203 may be a bulk acoustic wave (e.g., BAW or FBAR) device. First metal layer 2031 and second metal layer 2032 may be used as electrodes. Several more layers of dielectric layers (e.g., aluminum layers) and metal layers (e.g., molybdenum layers) may alternatively be formed between the first and second metal layers. It should be appreciated that, for brevity and in order to avoid obfuscating teachings of the present invention, well-known methods, procedures, and components have not been described in detail, for example, the bulk acoustic wave device (e.g., BAW or FBAR) is solely shown as an example, the scope of the present invention, however, is not limited to the illustrated subassembly structure herein.

Figure 3:
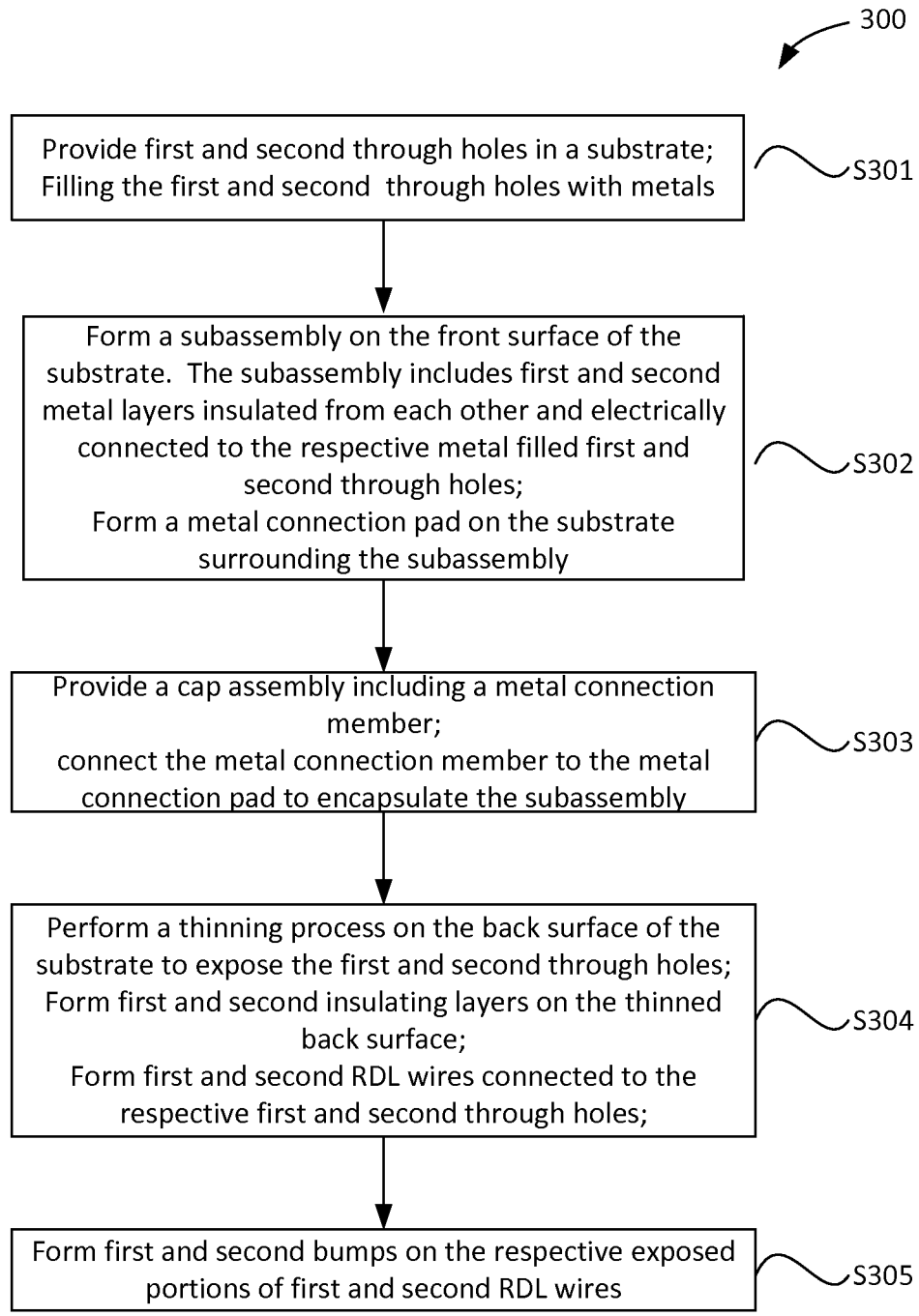
FIG. 3 is a flow chart that includes steps of a manufacturing method for a semiconductor device according to some embodiments of the present invention.
Figure 4A:
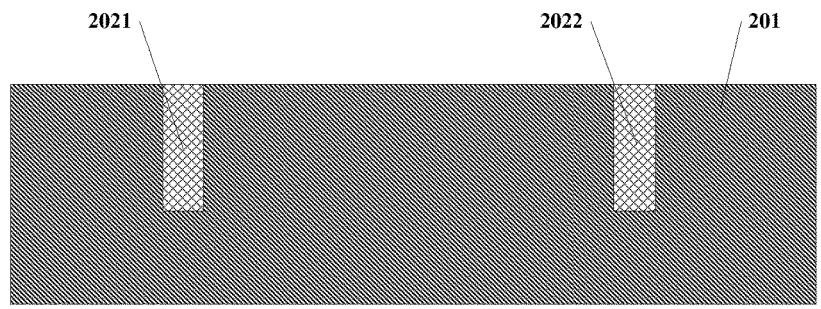
FIG. 4A is a cross-sectional view of an intermediate stage of a method for manufacturing a semiconductor device according to some embodiments of the present invention.

FIG. 3 is a flow chart that includes steps of a manufacturing method 300 according to certain embodiments of the present invention. At S301, a substrate having a front surface and a back surface opposite the front surface is provided, and first and second through holes are formed in the substrate, and a metal material is filled in the first and second through holes. Referring to FIG. 4A, a first through hole 2021 and second through hole 2022 are formed in a substrate 201, and a metal is filled in the first and second through holes. For example, substrate 201 is a silicon substrate, first and second through holes 2021, 2022 may be filled with copper, aluminum, or tungsten. The through holes are filled with metals. In the filling process, the through holes may not be completely filled with metals, i.e., voids may be present in the through holes, as long as there is no disconnection in the filled metal material in the through holes. Of course, the through holes may also be completely filled with metals, i.e., voids are completely absent in the through holes. Due to the complete filling of the through holes, a better consistency of thermal expansion can be achieved, and the through holes are not prone to open circuit. This results in a lower and more stable resistivity, and better reliability.

At S302, a subassembly is formed on the front surface of the substrate. The subassembly may include a first metal layer, and a second metal layer insulated from the first metal layer. The first metal layer is electrically connected to the metal filled in the first through hole, and the second metal layer is electrically connected to the metal filled in the second through hole. A metal connection pad is formed on the substrate and may completely surround the subassembly.

Figure 4B:
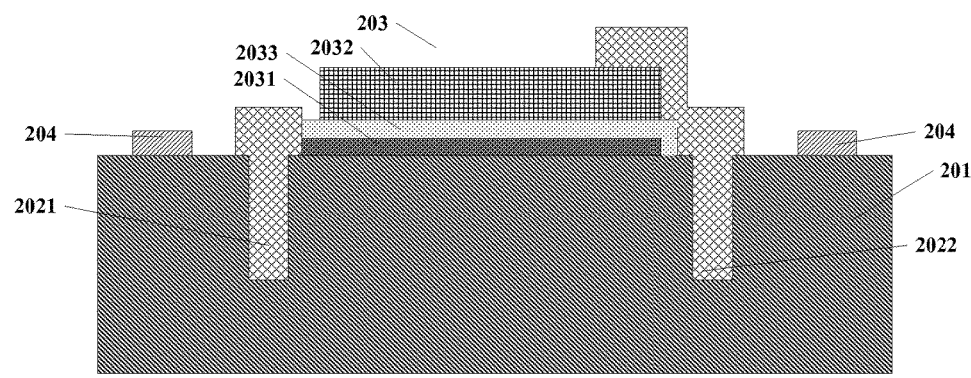
FIG. 4B is a cross-sectional view of an intermediate stage of a method for manufacturing a semiconductor device according to some embodiments of the present invention.

Referring to FIG. 4B, a subassembly 203 is formed on substrate 201. In some embodiments, subassembly 203 includes a first metal layer 2031 (e.g., a molybdenum layer), a second metal layer 2032 (e.g., a molybdenum layer), and a dielectric layer 2033 (e.g., an aluminum nitride layer) disposed between the first and second metal layers. In some embodiments, subassembly 203 may be a bulk acoustic device (e.g., BAW or FBAR), first and second metal layers 2031, 2032 each may be used as electrodes. Several more layers of dielectric layers (e.g., aluminum layers) and metal layers (e.g., molybdenum layers) may alternatively be formed between the first and second metal layers. In some embodiments, the subassembly may be formed by alternatively depositing or growing and etching a metal layer and a dielectric layer. Thereafter, for example, through deposition and etching processes, the metal filled in the first through hole and the metal filled in the second through hole are electrically connected to the first metal layer and the second metal layer, respectively. It should be appreciated that, for brevity and in order to avoid obfuscating teachings of the present invention, well-known methods, procedures, and components have not been described in detail, for example, the bulk acoustic wave device (e.g., BAW or FBAR) is solely shown as an example, the scope of the present invention, however, is not limited to the illustrated subassembly structure herein. Those skilled in the art are able to implement the above-described technical solutions.

In this step, a metal connection pad is formed on the substrate and surrounds the subassembly. As shown in FIG. 4B, a metal connection pad 204 is formed on substrate 201 and entirely surrounds subassembly 203. Looking down from the subassembly in the direction toward the substrate, the metal connection pad may have a square, rectangular, circular ring-like shape (not shown in FIG. 4B). In other words, the image of a perpendicular projection of the subassembly is entirely surrounded by the metal connection pad. The metal connection pad is configured to electrically connect to a metal connector member of a cap assembly as a package encapsulation over the subassembly. In some embodiments, the metal connection member and the metal connection pad may be copper to form a copper-copper bonding. In other embodiments, the metal connection member and the metal connection pad may be aluminum and germanium, respectively, to form an aluminum-germanium bonding structure. Thus, the scope of the present invention is not limited to the metal materials of the metal connection member and the metal connection pad.

In some embodiments, prior to forming the metal connection pad, a patterned insulating layer may be formed on the substrate, and the metal connection pad is formed on the patterned insulating layer. For example, a patterned oxide (e.g., silicon oxide) or a nitride (e.g., silicon nitride) layer can be formed as an insulating layer by deposition and etching on the substrate, a metal connection pad is then formed on the insulating layer, so that the insulating layer is disposed between the metal connection pad and the substrate.

Figure 4C:
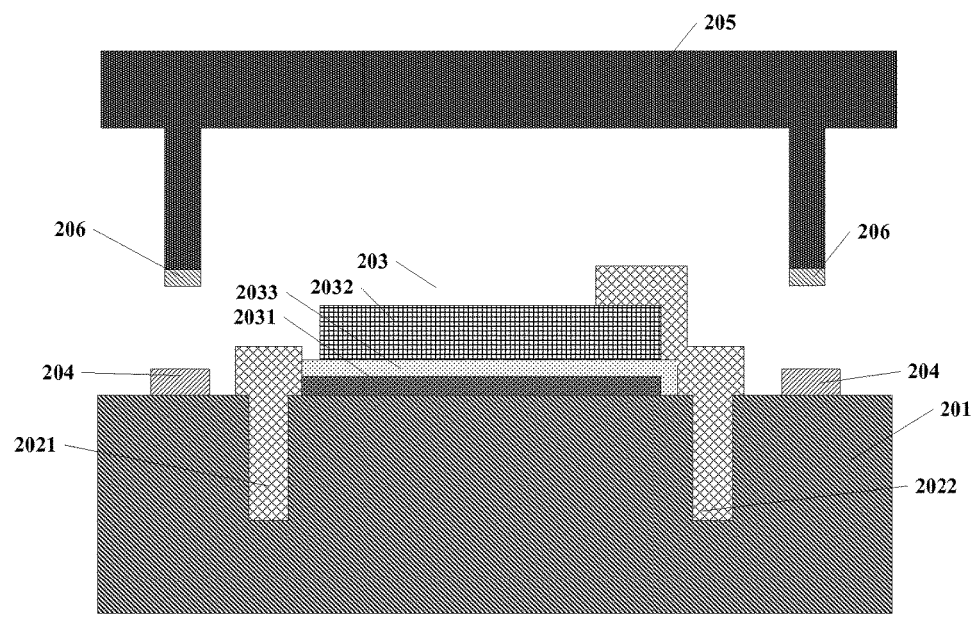
FIG. 4C is a cross-sectional view of an intermediate stage of a method for manufacturing a semiconductor device according to some embodiments of the present invention.

At S303, a cap assembly including a metal connection is provided. The metal connection member of the cap assembly is bonded to the metal connection pad. Referring to FIG. 4C, a cap assembly 205 includes a metal connection member 206, which is aligned with and bonded to metal connection pad 204 to package the subassembly. In an embodiment, if the metal connection member and the metal connection pad are copper, then the bonding is a copper-copper bonding. The copper-copper bonding process may be performed at a temperature in the range between 400 and 410 degrees C., a time duration between about 1 and 2 hours, and under a compression pressure in the range between about 2000 and about 3000 Newton. It will be appreciated that the described bonding process is merely a non-limiting example and should not limit the scope of the present invention. Using copper-copper bonding may reduce costs and is also compatible with the CMOS device manufacturing processes.

At S304, a thinning process is performed on the back surface of the substrate to expose the first and second through holes, so that the first and second through holes go through the substrate. As illustrated in FIG. 2A, a portion of the back surface of substrate 201 can be removed by performing an etching or chemical-mechanical planarization (CMP) polishing process to expose first through hole 2021 and second through hole 2022, so that the first and second through holes penetrate through substrate 201.

A semiconductor device may be formed using the above-described manufacturing processes, in accordance with some embodiments of the present invention. The first and second through holes are filled with a metal. The filled metals in the first and second through holes are electrically connected to the respective first and second metal layers of the subassembly, and the first and second metal layers are insulated from each other and serve as the electrodes of the subassembly. Because the subassembly can electrically connect to an external electronic circuit through the metal filled first and second through holes as electrodes without passing through the contact interface between the metal connection member and the metal connection pad, the resistance of the contact interface will not be affected, thereby avoiding the issues of poor device performance due to a change in resistance. The manufacturing method of the present invention can be applied to CMOS device packaging processes.

Further, since copper, aluminum or tungsten is utilized to fill the through holes, the problem of metal contamination in the device manufacturing process can be avoided and the manufacturing costs can be reduced.

In some embodiments, prior to forming the first and second through holes, method 300 may also include forming a cavity in the substrate, and filling the cavity with a filler material. Method 300 also includes removing the cavity filler material after forming the subassembly, as shown in FIG. 2B.

In some embodiments, method 300 also includes forming a first redistribution layer (RDL) wire and a second RDL wire on the back surface of the substrate. The first RDL wire is electrically connected to the metal filled in the first through hole, and the second RDL wire is electrically connected to the metal filled in the second through hole.

In some embodiments, method 300 also includes, after thinning the back surface of the substrate to expose the first and second through hole, forming a first insulating layer and a second insulating layer on the first insulating layer (S304). The first insulating layer and the second insulating layer surround the first RDL wire and the second RDL wire, so that the first and second RDL wires are insulated from each other and from the external environment, thereby protecting the RDL wires from external interference.

In some embodiments, method 300 also includes forming first and second bumps on respective exposed portions of first and second RDL wires, so that the first bump is electrically connected to the first RDL wire, and the second bump is electrically connected to the second RDL wire, and the first and second bumps are contact points for connecting to an external circuit (S305). Forming the first and second RDL wires and the respective bumps will be described in greater detail below.

FIGS. 5A through 5F are cross-sectional view of intermediate stages of a method for manufacturing a redistribution layer and bumps according to some embodiments of the present invention.

Figure 5A:
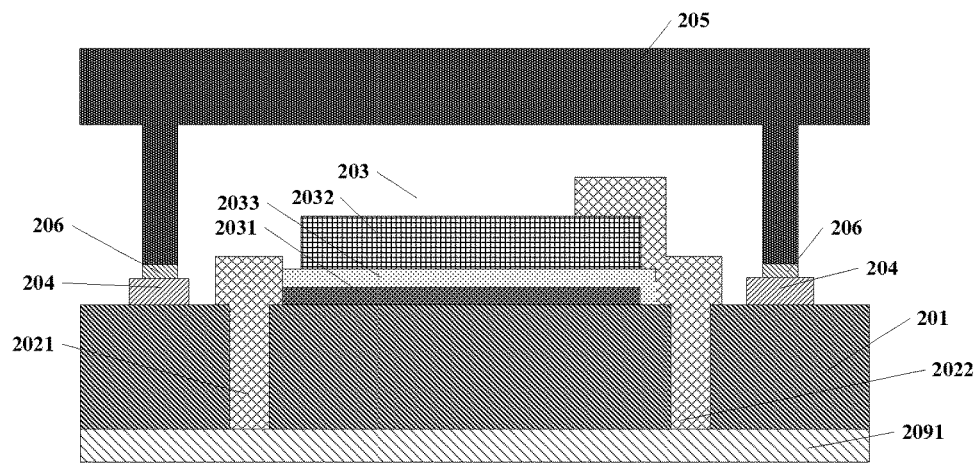
FIG. 5A is a cross-sectional view of an intermediate stage of a method for manufacturing a semiconductor device according to some embodiments of the present invention.

First, a first insulating layer 2091 (also referred to as a passivation layer) is formed on the back surface of substrate 201, as shown in FIG. 5A. In an embodiment, first insulating layer 2091 may be formed by a coating or deposition process. First insulating layer 2091 may be made of PBO, or other insulating materials.

Figure 5B:
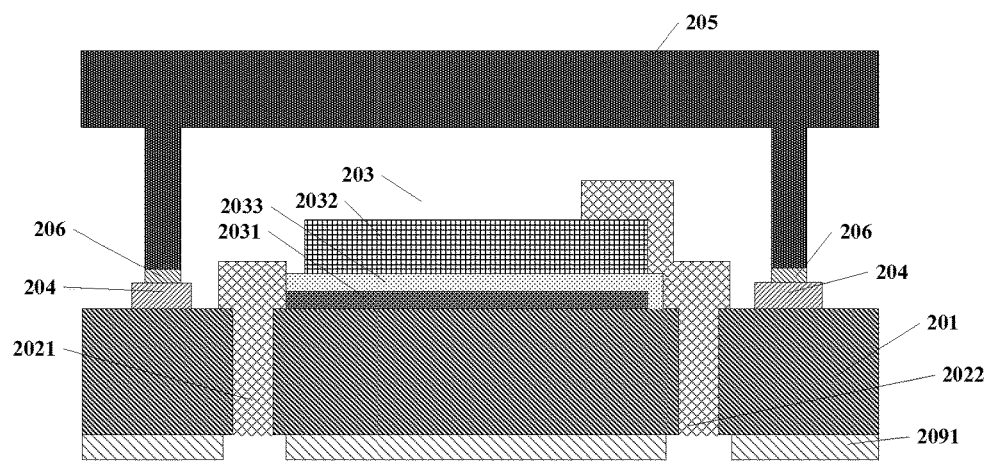
FIG. 5B is a cross-sectional view of an intermediate stage of a method for manufacturing a semiconductor device according to some embodiments of the present invention.

Thereafter, first insulating layer 2091 is etched to form two openings to expose first through hole 2021 and second through hole 2022, as shown in FIG. 5B. In an embodiment, first insulating layer 2091 may be coated with a photoresist, which is exposed using a patterned lithography mask, and then developed to form a patterned photoresist. First insulating layer 2091 is then etched using the patterned photoresist as a mask to form the two openings respectively exposing first through hole 2021 and second through hole 2022.

Figure 5C:
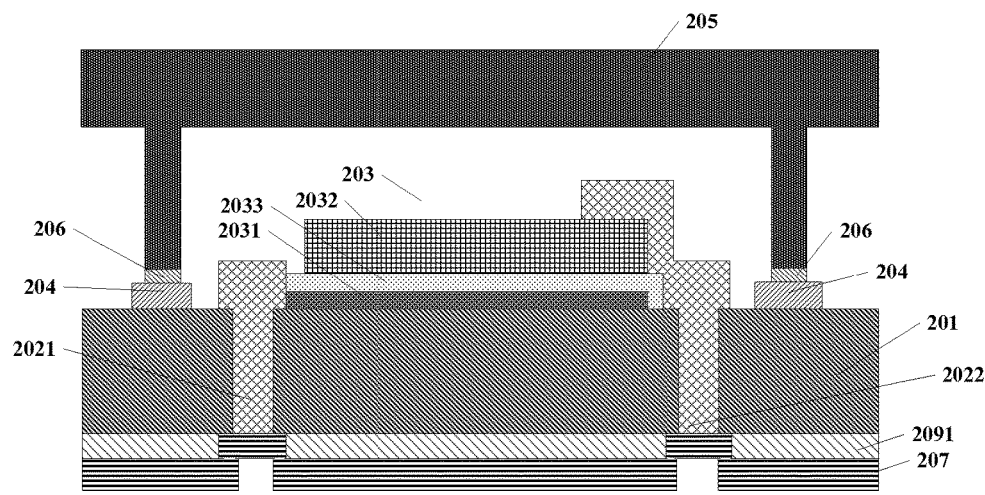
FIG. 5C is a cross-sectional view of an intermediate stage of a method for manufacturing a semiconductor device according to some embodiments of the present invention.

Next, a redistribution material layer 207 is formed on first insulating layer 2091, redistribution material layer 207 is electrically connected to the metal filled in first through hole 2021 and the metal filled in second through hole 2022, as shown in FIG. 5C. For example, redistribution material layer 207 may be formed using a PVD (physical vapor deposition) process. In some embodiments, redistribution material layer 207 may be of copper.

Figure 5D:
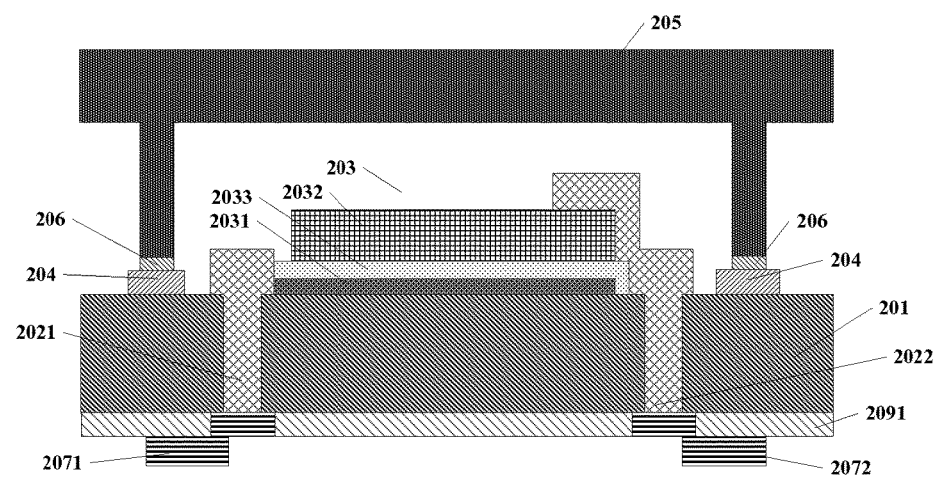
FIG. 5D is a cross-sectional view of an intermediate stage of a method for manufacturing a semiconductor device according to some embodiments of the present invention.

Next, redistribution material layer 207 is patterned to form a first redistribution layer (RDL) wire 2071 and a second RDL wire 2072, the first and second RDL wires are insulated from each other, as shown in FIG. 5D. For example, a patterned photoresist is formed on redistribution material layer 207, which is then etched using the patterned photoresist as a mask to form first RDL wire 2071 and second RDL wire 2072.

Figure 5E:
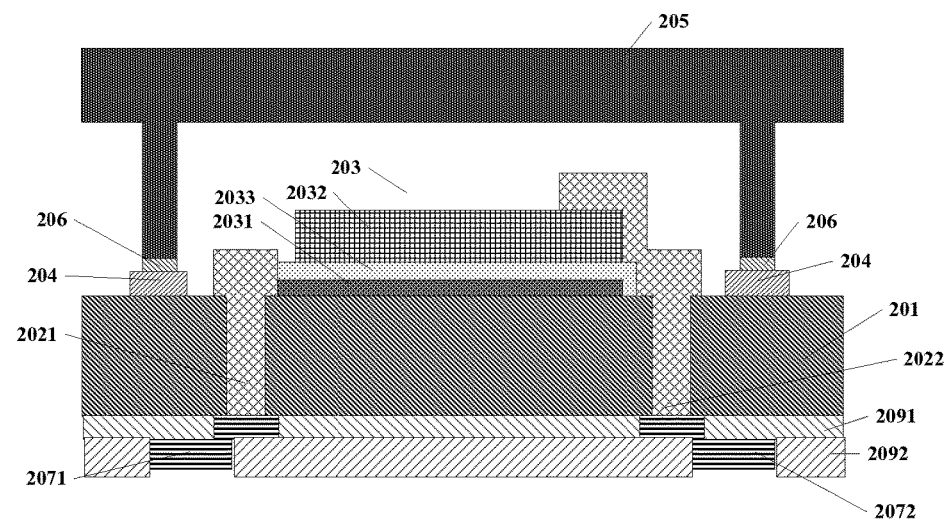
FIG. 5E is a cross-sectional view of an intermediate stage of a method for manufacturing a semiconductor device according to some embodiments of the present invention.

Next, a second insulating layer 2092 is formed on first insulating layer 2091, first RDL wire 2071 and second RDL wire 2072. Second insulating layer 2092 is then etched to expose at least a portion of first RDL wire 2071 and at least a portion of second RDL wire 2072, as shown in FIG. 5E. Second insulating layer 2092 may be formed by a coating or deposition process. Second insulating layer 2092 may be PBO or other insulating materials.

Figure 5F:
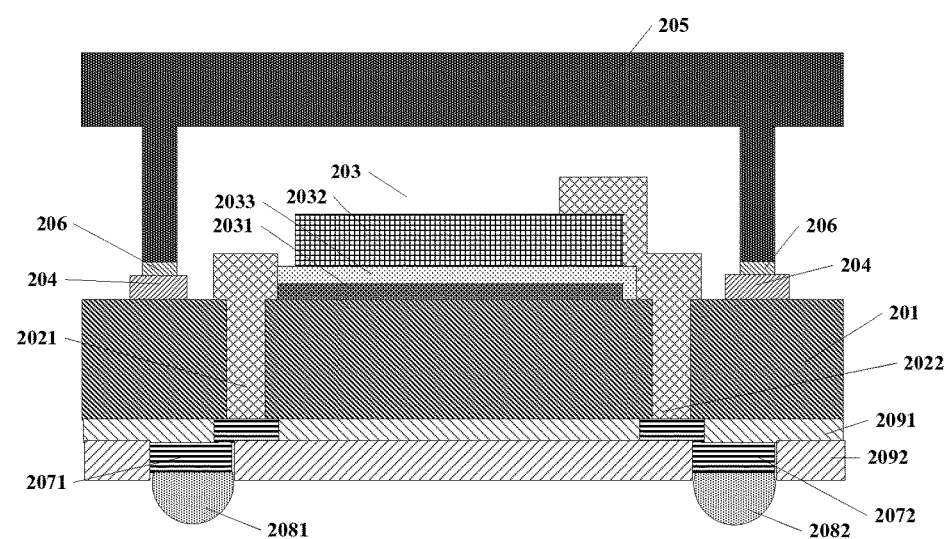
FIG. 5F is a cross-sectional view of an intermediate stage of a method for manufacturing a semiconductor device according to some embodiments of the present invention.

Next, a first bump 2081 is formed on the at least exposed portion of first RDL wire 2071, and a second bump 2082 is formed on the at least exposed portion of second RDL wire 2072, the first and second bumps are insulating from each other, as shown in FIG. 5F. For example, the bumps may be spherical contact points that can be formed by a solder bump process or a ball drop process.

Thus, first RDL the processes of forming wire 2071, second RDL wire 2072, first bump 2081, second bump 2082, first insulating layer 2091 and second insulating layer 2092 have been described in detail.

A method of forming first and second through holes will be described in detail below in conjunction with FIGS. 6A through 6C and FIG. 4A.

Figure 6A:
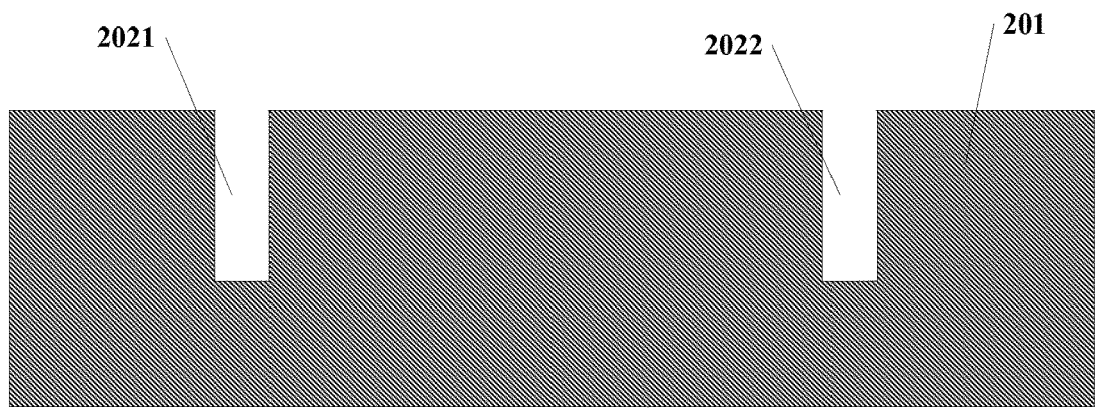
FIG. 6A is a cross-sectional view of an intermediate stage of a method of filling first and second through holes with metal according to some embodiments of the present invention.

First, a first through hole 2021 and a second through hole 2022 are formed in a substrate 201, as shown in FIG. 6A. First through hole 2021 and a second through hole 2022 may be formed using a deep reactive ion etching (DRIE) process.

Figure 6B:
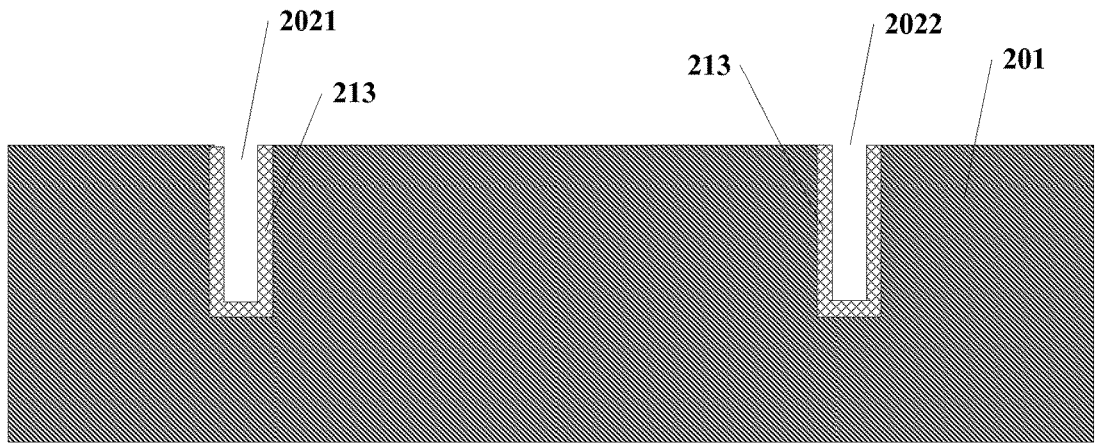
FIG. 6B is a cross-sectional view of an intermediate stage of a method of filling first and second through holes with metal according to some embodiments of the present invention.

Thereafter, a seed layer 213 is formed on the bottom and side walls of first and second through holes 2021, 2022, as shown in FIG. 6B. For example, a PVD process may be used to form the seed layer. The material of the seed layer may include a Ta/Cu alloy (i.e., an alloy including copper and tantalum). Of course, other seed layers may be formed for filling aluminum or tungsten.

Figure 6C:
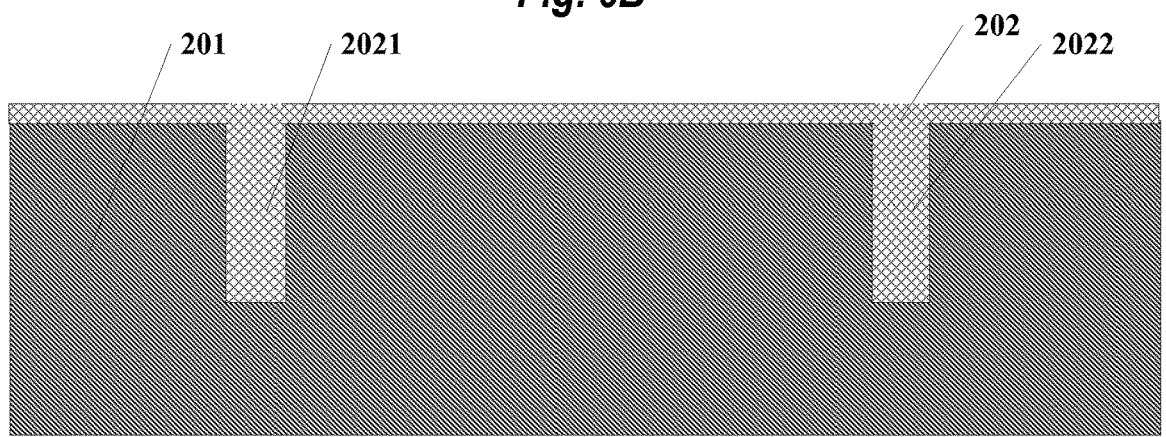
FIG. 6C is a cross-sectional view of an intermediate stage of a method of filling first and second through holes with metal according to some embodiments of the present invention.

Next, first and second through holes 2021, 2022 may be filled by plating. In this filling process, a metal layer may be formed as shown in FIG. 6C. For example, in the case where the seed layer is a Ta/Cu alloy, the first and second through holes can be filled with copper using a copper plating process.

Next, substrate 201 is planarized, as shown in FIG. 4A. For example, the metal layer 202 on the surface of the substrate 201 can be removed using a CMP process, which also planarizes the substrate surface.

Thus, the process of forming first and second metal through holes has been described in detail.

In other embodiments, after planarizing the substrate and forming the first and second through holes, an annealing process may further be performed to reduce stress and to lower the resistance of the filled metal. In an embodiment, the annealing process may be performed at a temperature range between about 350° C. to 450° C.

In some embodiments, prior to bonding the metal connection member of the cap assembly with the metal connection pad of the subassembly, the method of manufacturing the semiconductor device may further include forming the cap assembly including the metal connection member. The method of forming the cap assembly will be described in detail together with FIGS. 7A through 7F.

Figure 7A:
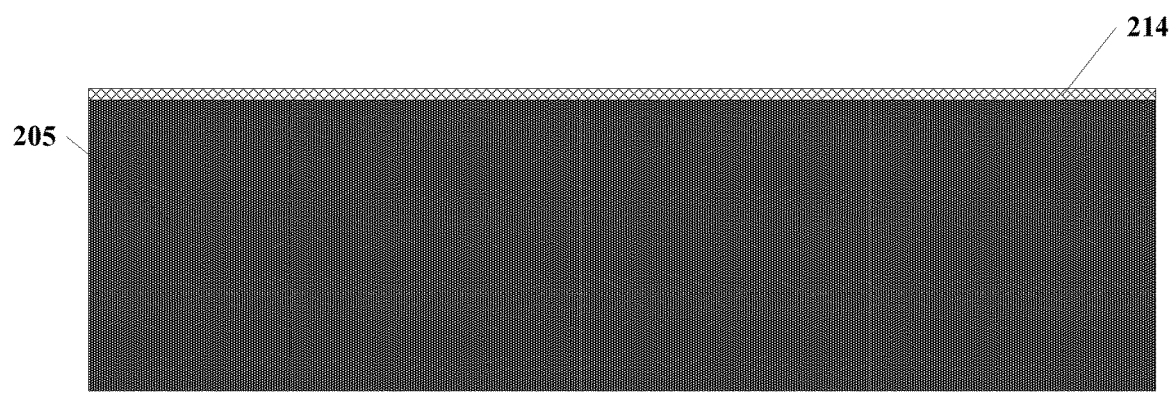
FIG. 7A is a cross-sectional view of an intermediate stage of a method for a cap assembly according to some embodiments of the present invention.

First, a seed layer 214 is formed on a semiconductor substrate 205, as shown in FIG. 7A. For example, semiconductor substrate 205 may be a silicon substrate, and the seed layer may include a Ti/Cu alloy (i.e., a titanium-copper alloy). For example, the seed layer may be formed on the semiconductor substrate using a deposition process.

Figure 7B:
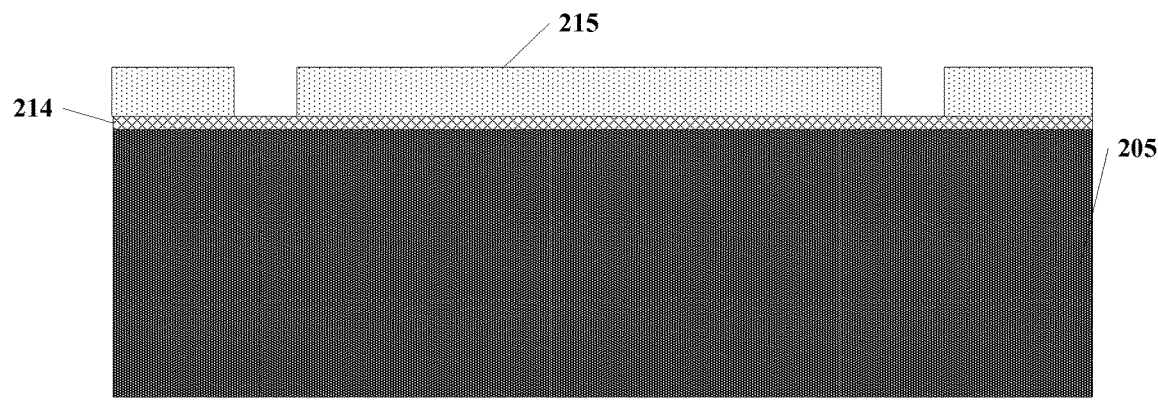
FIG. 7B is a cross-sectional view of an intermediate stage of a method for a cap assembly according to some embodiments of the present invention.

Thereafter, a first patterned barrier layer 215 is formed on seed layer 214, as shown in FIG. 7B. For example, first patterned barrier layer 215 may be a patterned photoresist.

Figure 7C:
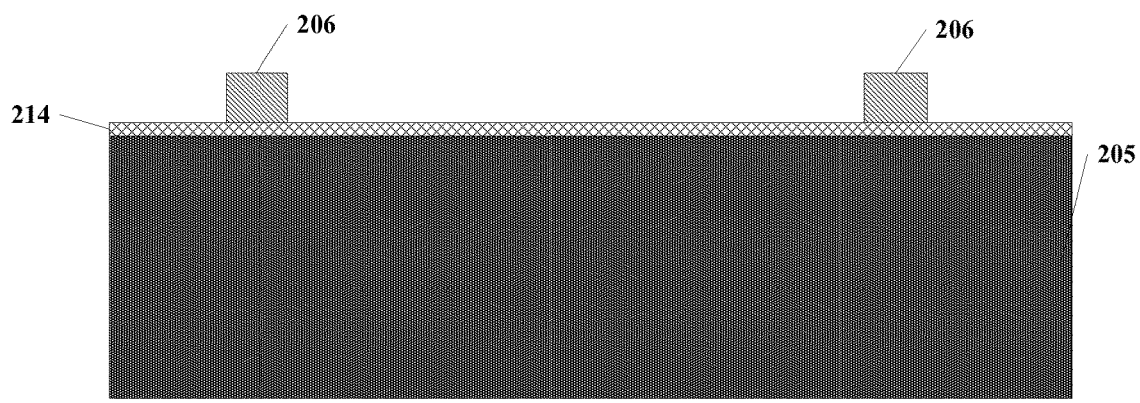
FIG. 7C is a cross-sectional view of an intermediate stage of a method of a cap assembly according to some embodiments of the present invention.

Next, a metal connection layer 206 is formed by performing a metal plating and stripping process, as shown in FIG. 7C. For example, in the case where the seed layer is a Ti/Cu alloy, a copper layer may be formed by a copper electroplating process, first barrier layer 215 including the copper layer is then removed by a lift-off process, thereby forming a metal connection member 206. In this exemplary embodiment, metal connection member 206 is a copper connection member. Of course, metal connection member 206 may include other metal materials. It will be appreciated by those skilled in the art that the metal connection member can be square, rectangular, circular ring-like and others, in order to be able to bond with a metal connection pad.

Figure 7D:
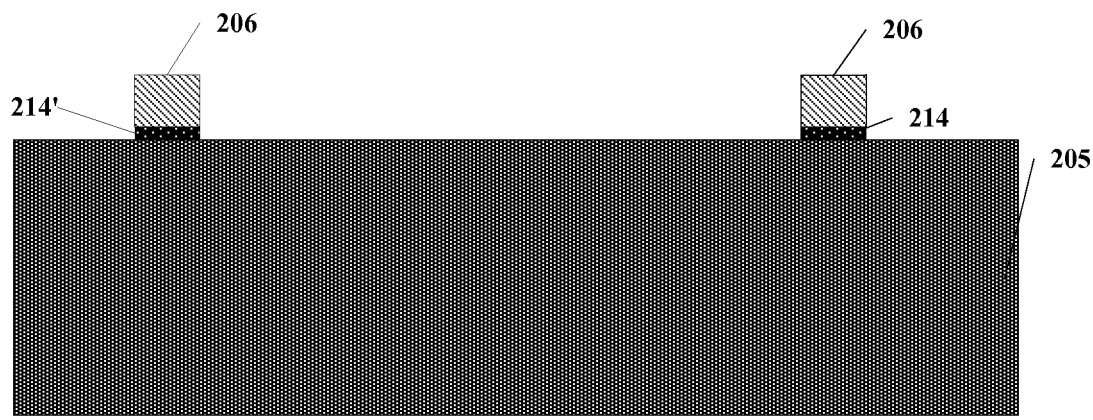
FIG. 7D is a cross-sectional view of an intermediate stage of a method of a cap assembly according to some embodiments of the present invention.

Next, seed layer 214 is etched, using metal connection member 206 as a mask, to form a seed layer structure 214', as shown in FIG. 7D.

Figure 7E:
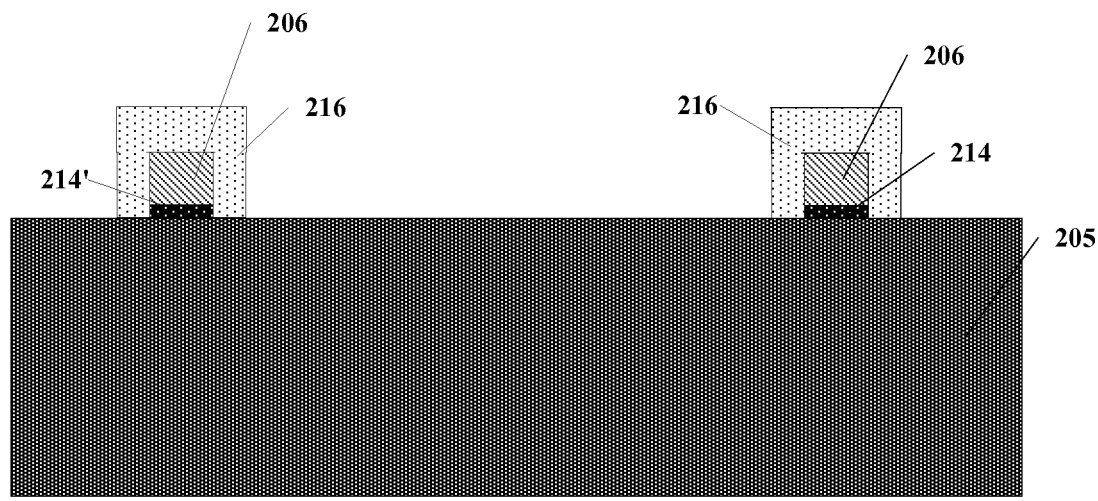
FIG. 7E is a cross-sectional view of an intermediate stage of a method of a cap assembly according to some embodiments of the present invention.

Next, a second patterned barrier layer 216 is formed on semiconductor substrate 205 covering metal connection member 206 and seed layer structure 214', as shown in FIG. 7E. For example, second barrier layer 216 may be a photoresist coated on semiconductor substrate 205, and the photoresist is then patterned using a lithography process.

Figure 7F:
FIG. 7F is a cross-sectional view of an intermediate stage of a method of a cap assembly according to some embodiments of the present invention.

Next, an exposed portion of semiconductor substrate 205 is etched, using second patterned barrier layer 216 as a mask, to form a recess 218 in the semiconductor substrate. Second patterned barrier layer 216 is then removed to obtain the cap assembly, as shown in FIG. 7F.

Thus, the process of forming the cap assembly has been described in detail. In the embodiment, the cap assembly includes a metal connection member 206 and seed layer 214'. Those of skill in the art will appreciate that the seed layer structure 214' may be very thin so that it is not schematically shown in some drawings. However, in practical applications, the cap assembly includes thin seed layer structure 214'.

Another method for forming a semiconductor device will be described in detail below in conjunction with FIGS. 8A through 8E and together with FIG. 2B, in accordance with some embodiments of the present invention.

Figure 8A:
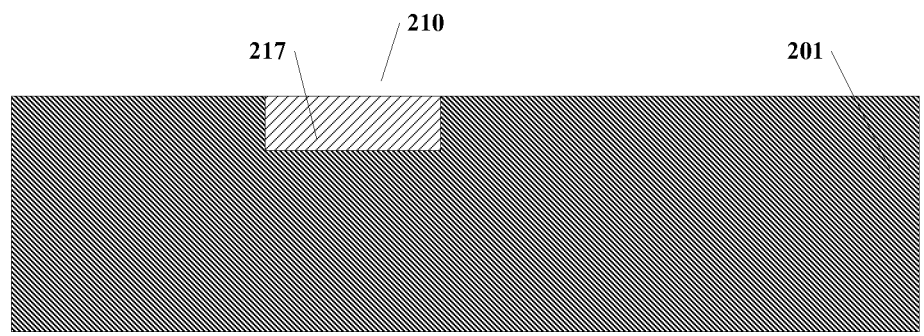
FIG. 8A is a cross-sectional view of an intermediate stage of a method for manufacturing a semiconductor device according to some embodiments of the present invention.

First, a cavity 210 is formed in substrate 201, and then filled with a filler material 217, as shown in FIG. 8A. For example, a recess may be formed by etching in the substrate, i.e., the cavity, a filler material is then formed using a deposition process in the cavity. The filler material may be a silicon oxide. The cavity in the substrate is used to prevent high frequency losses (e.g., eddy current loss).

Figure 8B:
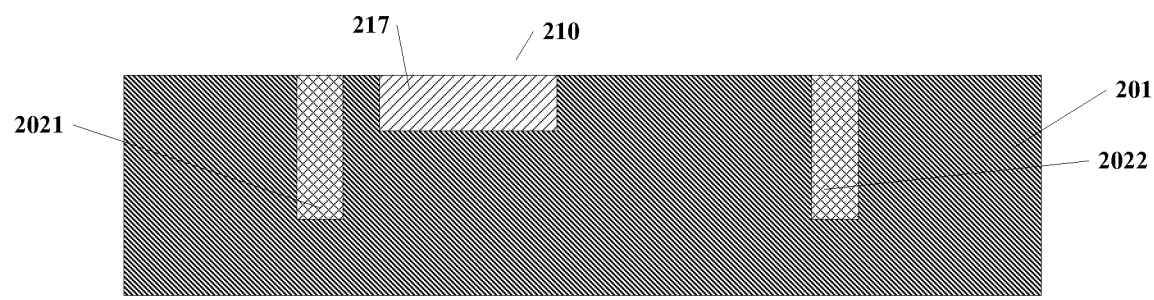
FIG. 8B is a cross-sectional view of an intermediate stage of a method for manufacturing a semiconductor device according to some embodiments of the present invention.

Thereafter, a first through hole 2021 and a second through hole 2022 are formed in substrate 201, first and second through holes are then filled with a metal, as shown in FIG. 8B.

Figure 8C:
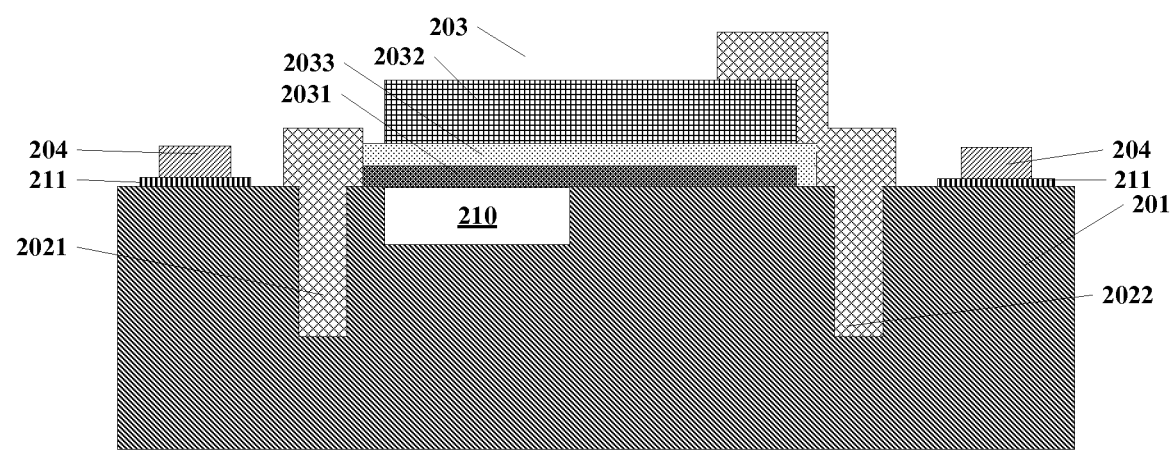
FIG. 8C is a cross-sectional view of an intermediate stage of a method for manufacturing a semiconductor device according to some embodiments of the present invention.

Thereafter, a subassembly 203 is formed on substrate 201. Subassembly 203 may include a first metal layer 2031 on the substrate and covering the cavity and a second metal layer 2032 insulating from the first insulating layer. First metal layer 2031 is electrically connected to the metal filled in first through hole 2021, and second metal layer 2032 is electrically connected to the metal filled in second through hole 2022. A patterned insulating layer 211 is formed on substrate 201. A metal connection pad 204 is formed on patterned insulating layer 211. After the formation of metal connection pad 204, the filler material 217 is removed from the cavity, as shown in FIG. 8C. For example, an opening (not shown) can be formed in substrate 201 next to subassembly 203 to reach the cavity. A etching selectivity solution (e.g., an etching liquid solution having a high selectivity for etching the filler material) may be injected into the cavity through the opening as to etch away the filler material in the cavity. For example, in the case where the filler material is a silicon oxide, the etching selectivity solution may be a buffer oxide etch (BOE) liquid solution for etching the silicon oxide. After removing the filler material in the cavity, the cavity can be dried using a drying process.

Figure 8D:
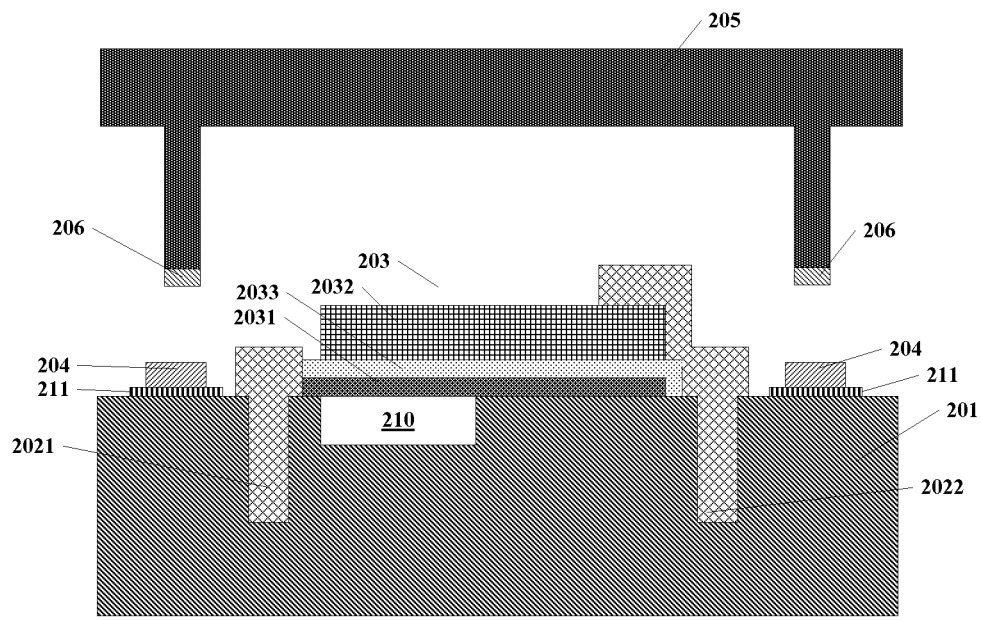
FIG. 8D is a cross-sectional view of an intermediate stage of a method for manufacturing a semiconductor device according to some embodiments of the present invention.

Thereafter, metal connection member 206 of cap assembly 205 is bonded with metal connection pad 204, as shown in FIG. 8D.

Figure 8E:
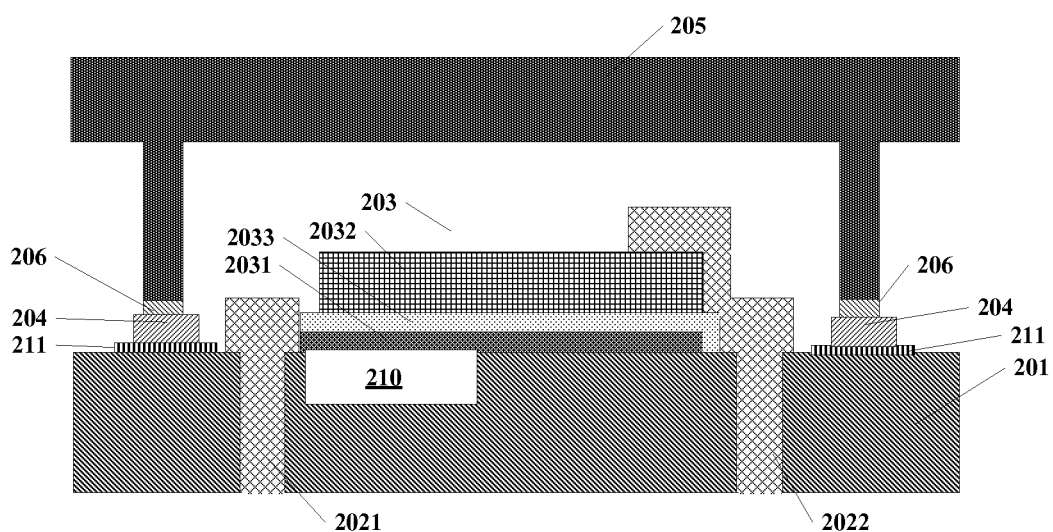
FIG. 8E is a cross-sectional view of an intermediate stage of a method for manufacturing a semiconductor device according to some embodiments of the present invention.

Thereafter, a thinning process is performed on the back surface of substrate 201 to form a first through hole 2021 and a second through hole 2022, as shown in FIG. 8E.

Thereafter, a first redistribution layer (RDL) wire 2071, a second RDL wire 2072, a first bump 2081, a second bump 2082, a first insulating layer 2091 and a second insulating layer 292 are formed on the back surface of substrate 201, as shown in FIG. 2B. First RDL wire 2071 is electrically connected with the metal filled in first through hole 2021, second RDL wire 2072 is electrically connected with the metal filled in second through hole 2022. First insulating layer 2091 and second insulating layer 2092 surround first and second RDL wires 2071, 2072, so that the first and second RDL wires are electrically insulating from each other and free from external interference. First bump 2081 is electrically connected to first RDL wire 2071, and second bump 2082 is electrically connected to second RDL wire 2072. First and second bumps are electrically insulated from each other. The process of forming the redistribution layer wires and bumps has been described in detail in the above section and will not be repeated herein for the sake of brevity.

Thus, exemplary embodiments have described a semiconductor device and method for manufacturing the same in detail. In order to not obfuscate teachings of the present invention, well-known methods, procedures, and components have not been described in detail. It will be clear to those skilled in the art, after reading the present disclosure, how to make and use alternative embodiments of the invention to manufacture a semiconductor device.

While the invention has been described in terms of various specific embodiments, those of skill in the art will recognize that many modifications can be made to adapt to a particular application or material to the teachings of the invention. For example, the above-described embodiments may be used in combination with each other. Therefore, the appended claims should be construed broadly to include variants and embodiments of the invention.

What is claimed is:

1. A semiconductor device comprising:
   a substrate having a front surface and a back surface;
   a subassembly on the front surface of the substrate, the subassembly including a first metal layer and a second metal layer insulated from the first metal layer;
   a cap assembly including a metal connection member;
   first and second through holes extending through the substrate, the first and second through holes being filled with metals, the metal filled in the first through hole being electrically connected to the first metal layer, the metal filled in the second through hole being electrically connected to the second metal layer;
   a metal connection pad on the substrate and entirely surrounding the subassembly, the metal connection pad being bonded to the metal connection member;
   an insulating layer disposed between the substrate and the metal connection pad, the insulating layer having a bottom surface at a same level as a bottom surface of the first metal layer; and
   a cavity in the substrate disposed below the subassembly and directly below the first metal layer.

2. The semiconductor device of claim 1, further comprising:
   first and second redistribution layer (RDL) wires on the back surface, the first RDL wire being electrically connected to the metal filled in the first through hole, and the second RDL wire being electrically connected to the metal filled in the second through hole.

3. The semiconductor device of claim 2, further comprising:
   first and second bumps insulated from each other, the first bump being electrically connected to the first RDL wire, and the second bump being electrically connected to the second RDL wire.

4. The semiconductor device of claim 2, further comprising:
   a first insulating layer on the back surface of the substrate;
   a second insulating layer on the first insulating layer,
   wherein the first and second insulating layers surround the first and second RDL wires.

5. The semiconductor device of claim 1, further comprising a cavity in the substrate, wherein the insulating layer entirely surrounds the cavity and does not cover the cavity.

6. The semiconductor device of claim 1, wherein the metal filled in the first through hole and the metal filled in the second through hole each are made of copper, aluminum, or tungsten.

7. The semiconductor device of claim 1, wherein the metal connection member and the metal connection pad each are made of copper.

8. The semiconductor device of claim 1, wherein the metal connection member is made of aluminum or germanium, and the metal connection pad is made of aluminum or germanium.

9. The semiconductor device of claim 1, wherein the first and second metal layers are molybdenum layers.

10. The semiconductor device of claim 1, further comprising a dielectric layer disposed between the first metal layer and the second metal layer.

11. The semiconductor device of claim 10, wherein the dielectric layer comprises aluminum nitride.

12. The semiconductor device of claim 10, wherein the dielectric layer comprises a stack of alternating layers of dielectric layers and metal layers.

13. A semiconductor device comprising:
    a substrate having a front surface and a back surface;
    a subassembly on the front surface of the substrate, the subassembly including a first metal layer and a second metal layer separated from the first metal layer by a dielectric layer;
    a cap assembly including a metal connection member;
    first and second through holes extending through the substrate and filled with a metal material, the first through hole being electrically connected to the first metal layer, the second through hole being electrically connected to the second metal layer;

a metal connection pad on the substrate and entirely surrounding the subassembly, the metal connection pad being insulated from the first metal layer and the second metal layer; and a cavity directly below the first metal layer.

14. The semiconductor device of claim 13, wherein the cap assembly is bonded to the metal connection pad through the metal connection member.

15. The semiconductor device of claim 13, further comprising an insulating layer disposed between the substrate and the metal connection pad and not below the first and second metal layers.

16. The semiconductor device of claim 13, wherein the first and second metal layers each comprise molybdenum, and the dielectric layer comprises aluminum nitride.

17. The semiconductor device of claim 13, wherein the dielectric layer comprises a stack of alternating layers of dielectric layers and metal layers.

18. The semiconductor device of claim 13, wherein the metal connection member comprises aluminum or germanium, and the metal connection pad comprises aluminum or germanium.

19. The semiconductor device of claim 13, wherein the metal connection member comprises copper, and the metal connection pad comprises copper.

20. The semiconductor device of claim 13, wherein the metal connection member comprises a square, rectangular, or ring-like shape.

* * * * *